United States Patent
Morris

(10) Patent No.: US 6,282,622 B1
(45) Date of Patent: Aug. 28, 2001

(54) SYSTEM, METHOD, AND PROGRAM FOR DETECTING AND ASSURING DRAM ARRAYS

(76) Inventor: Joseph Norman Morris, 5404 Hideaway Dr., Chapel Hill, NC (US) 27516

( * ) Notice: Subject to any disclaimer, the term of this patent is extended or adjusted under 35 U.S.C. 154(b) by 0 days.

(21) Appl. No.: 09/131,814

(22) Filed: Aug. 10, 1998

(51) Int. Cl.$^7$ ............................................. G06F 12/06
(52) U.S. Cl. .................. 711/170; 711/105; 711/171; 711/172; 711/173; 711/213; 711/217; 711/218; 711/219
(58) Field of Search .................... 711/101, 103, 711/104, 105, 170–173, 211, 213, 217–219

(56) References Cited

U.S. PATENT DOCUMENTS

| | | | | |
|---|---|---|---|---|
| 5,003,506 | * | 3/1991 | Itaya | 711/172 |
| 5,179,686 | * | 1/1993 | White | 711/172 |
| 5,278,801 | * | 1/1994 | Dresser et al. | 711/105 |
| 5,386,383 | * | 1/1995 | Raghavachari | 711/105 |
| 5,522,062 | * | 5/1996 | Yamaki | 711/172 |
| 5,600,604 | * | 2/1997 | Chen | 365/230.06 |
| 5,604,880 | * | 2/1997 | Dipert | 711/103 |
| 5,701,438 | * | 12/1997 | Bains | 711/211 |
| 5,708,791 | * | 1/1998 | Davis | 711/105 |
| 5,802,603 | | 9/1998 | Bains et al. | 711/202 |
| 5,974,501 | * | 10/1999 | Shaver et al. | 711/105 |

FOREIGN PATENT DOCUMENTS 2 066 529    7/1981    (GB).

* cited by examiner

Primary Examiner—Than Nguyen

(57) ABSTRACT

A system, method, and program for detecting and assuring a row by column structure in a Dynamic Random Access Memory array is disclosed. By writing to and reading from each memory location of the DRAM array, memory integrity is assured. The number of columns in the DRAM array is identified by writing data to and reading data from addresses selected from a series of cell addresses. The series of cell addresses identify standard DRAM column structures. When the data written to and read from the cell address is identical, the column configuration of the DRAM arrays is identified. The number of rows in the memory array is then identified by writing data to and reading data from addresses selected from a second series of cell addresses. The second series of cell addresses identify standard DRAM row structures. When data written to and read from the cell address is identical, the row configuration of the DRAM array is identified and accordingly, the row by column structure and integrity of the DRAM array are known.

24 Claims, 7 Drawing Sheets

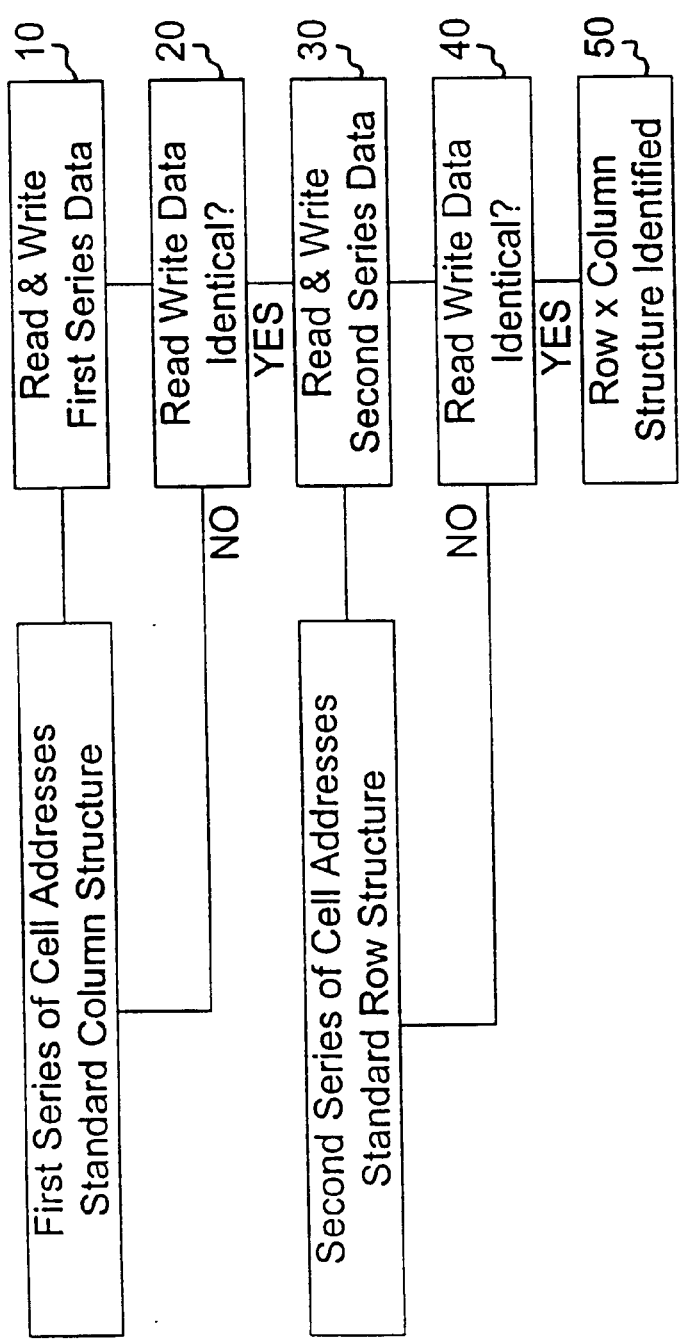

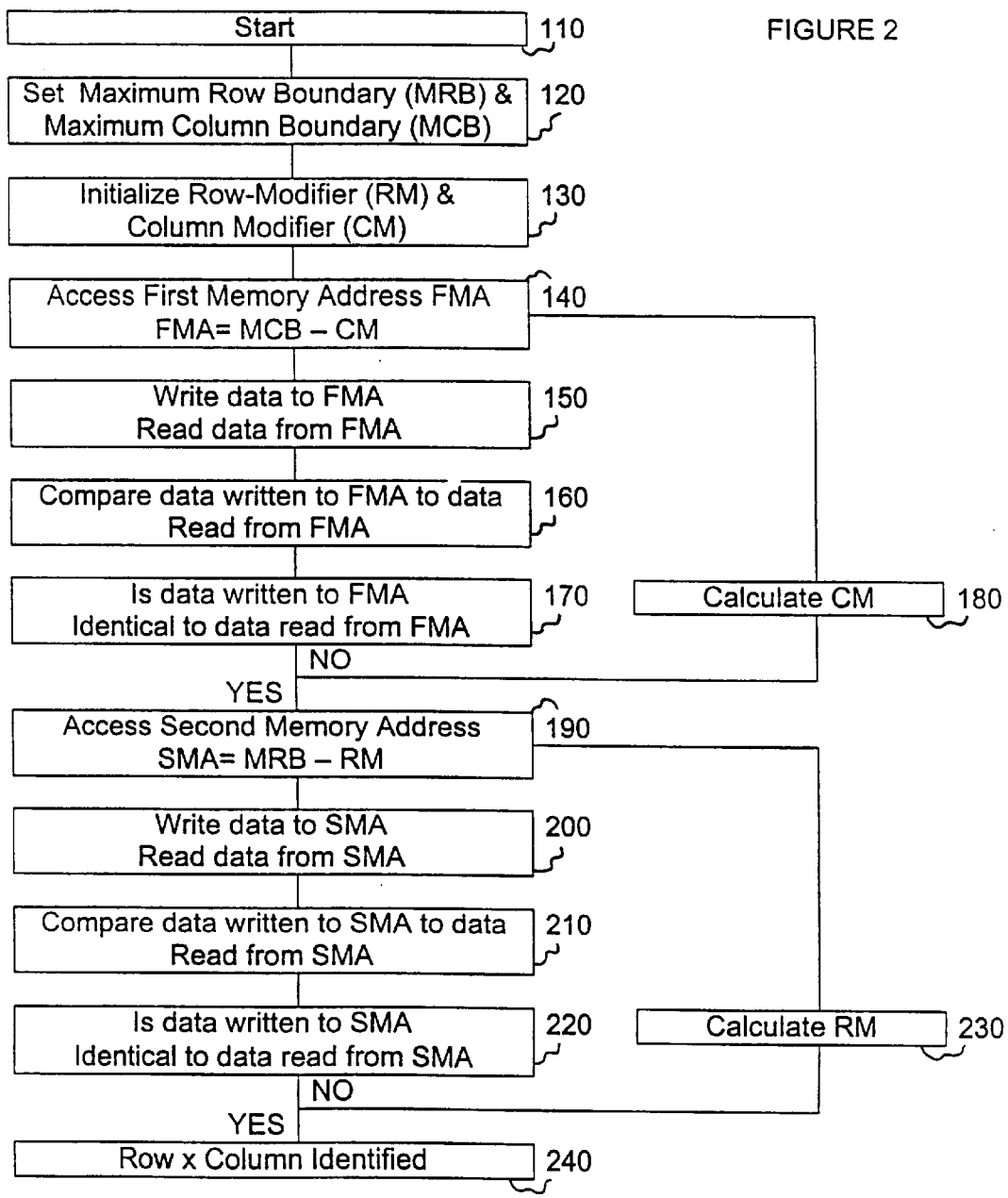

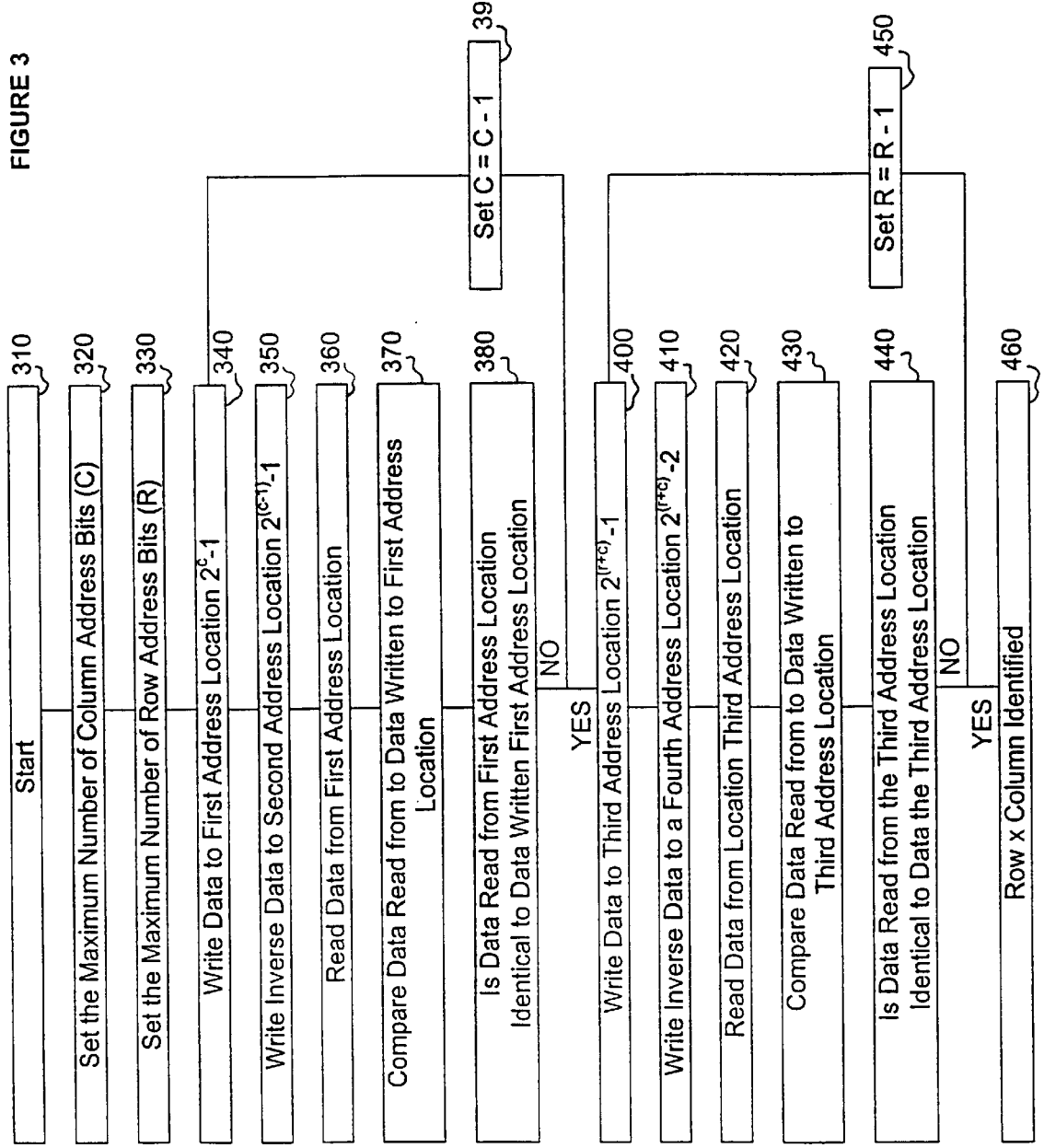

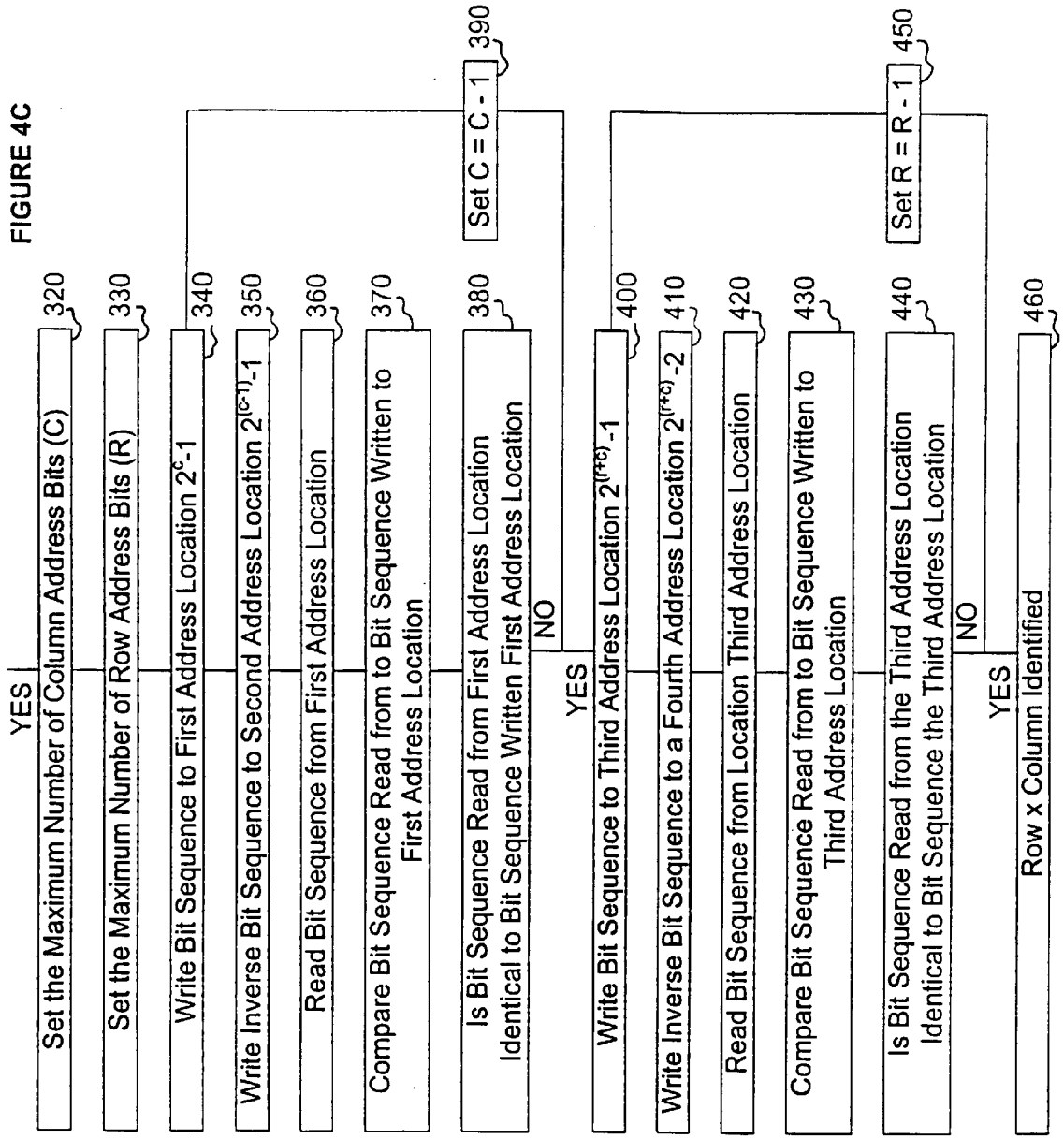

SYSTEM, METHOD, AND PROGRAM FOR DETECTING AND ASSURING DRAM ARRAYS

BACKGROUND OF THE INVENTION

The present invention relates to the field of detecting memory array architectures and in particular to a method, system, and product for detecting row by column structures in Dynamic Random Access Memory arrays.

DRAM is used in a wide variety of memory intensive applications. Consumer electronic devices, for example, phones, electronic organizers, compact disk players, etc., may use DRAM as it is relatively inexpensive and provides relatively fast access. In such devices, memory detection and integrity assurance must occur before the devices may function. Memory detection and integrity assurance are also important when the DRAM is exchanged or replaced, which may occur when upgrading or repairing devices, for example.

One known method of detecting DRAM modules employs detect bits. Detect bits are created when a zero ohm resistor associated with a DRAM module is coupled to a pull up resistor mounted in a receiving socket. When the socket receives the DRAM cell, the zero ohm resistor is coupled to the pull up resistor yielding a low value that uniquely identifies the DRAM's presence. Specific binary codes are created as DRAM modules are received by DRAM sockets.

Another known method of detecting DRAM modules employs serial Electrically Erasable Programmable Read Only Memory (EEPROM). The EEPROMs mount to the DRAM modules and store information relating to the DRAM's speed, size, and configuration.

The use of resistors and EEPROMs to detect memory structure consumes power, may cost valuable board real estate, may identify inaccurate structures, and may increase assembly cost—important considerations for memory applications where size is limited, performance is critical, and low cost is essential.

In light of the strengths and weaknesses of the conventional art, there is a need for a method, system, and product for detecting row by column structures of DRAM arrays. The method, system, and product should circumvent the problem of detecting memory arrays through collateral components while detecting data structures automatically through access routines. There is further need for a method, system, and product that detects memory architecture while assuring memory integrity.

SUMMARY OF THE INVENTION

A method, system, and product for detecting a row by column structure in a Dynamic Random Access Memory array is disclosed. According to a first aspect, the number of columns in a DRAM array is identified by writing data to and reading data from at least one address selected from a first series of cell addresses. The first series of cell addresses identify standard DRAM column structures. When the data written to and read from the cell address is identical, the column configuration of the DRAM arrays is identified. The number of rows in the memory array is then identified by writing data to and reading data from at least one address selected from a second series of cell addresses. The second series of cell addresses identify standard DRAM row structures. When data written to and read from the cell address is identical, the row configuration of the DRAM array is identified and accordingly, the row by column structure of the DRAM array is known.

According to a second aspect, the column structure of the DRAM array is detected by determining a maximum column boundary address, writing data to and reading data from a first memory address corresponding to the maximum column boundary address less a column-modifier, comparing the data read from to the data written to the first memory address, calculating the column-modifier, and then repeating the earlier steps until data read from the first memory address is identical to the data written to the first memory address. The routine next uncovers the row structure of the DRAM array by determining a maximum row boundary address, writing data to and reading data from a second memory address corresponding to the maximum row boundary address less a row-modifier, comparing the data read from to the data written to the second memory address, calculating the row-modifier, and repeating the earlier steps until data read from the second memory address is identical to the data written to the first memory address.

Memory integrity of the DRAM array may be assured in the first or second aspect by writing to and reading from each memory location of the DRAM array.

BRIEF DESCRIPTION OF THE DRAWINGS

FIG. 1 is a flow chart of a first embodiment of the invention.

FIG. 2 is a flow chart of a second embodiment of the invention.

FIG. 3 is a flow chart of a third embodiment of the invention.

FIGS. 4A–4C are a flow chart of a fourth embodiment of the invention.

DETAILED DESCRIPTION OF THE PRESENTLY PREFERRED EMBODIMENTS

Figure 4A:
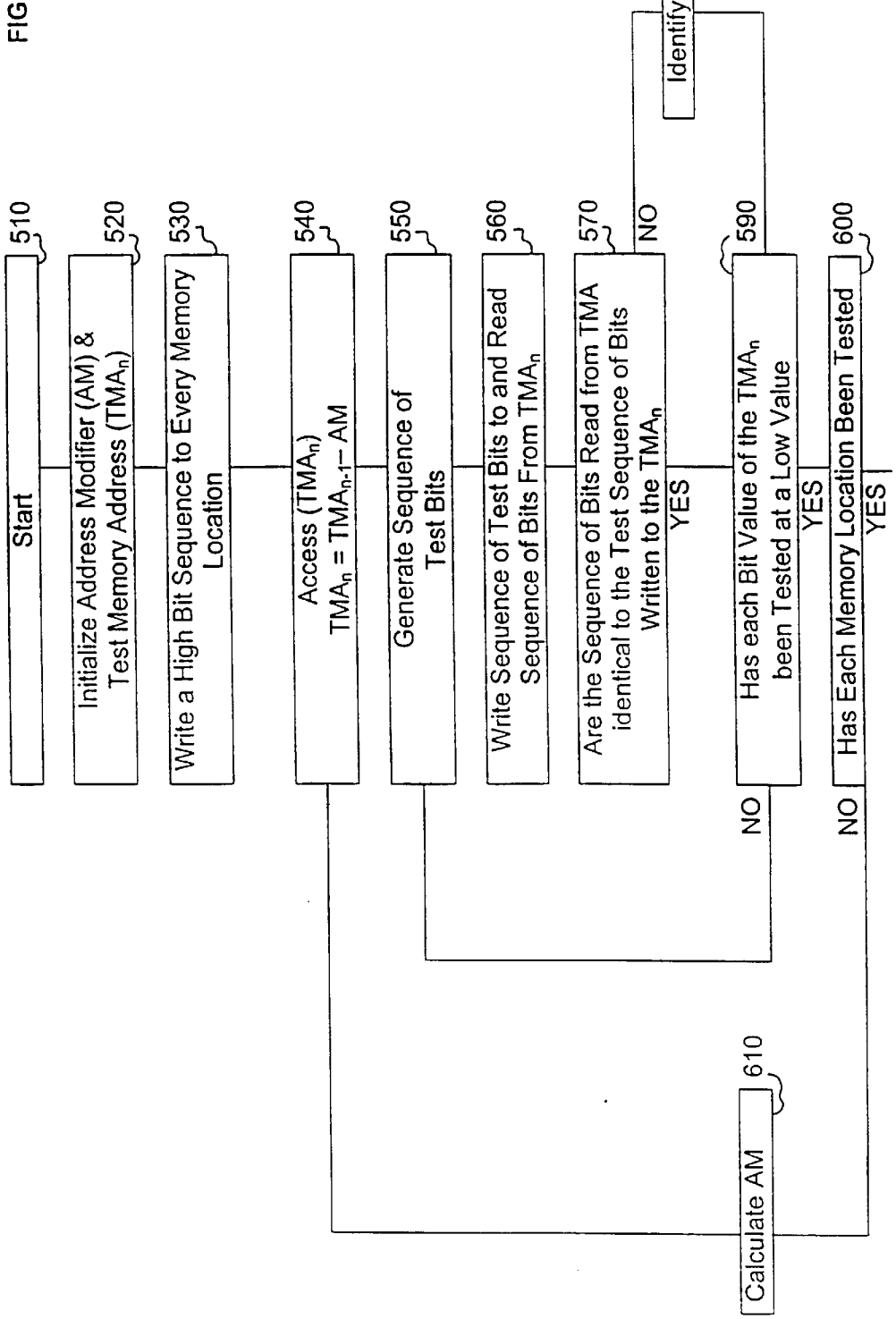

In the drawings depicted elements are not necessarily drawn to scale and the same reference numbers through several views designate alike and similar elements.

The disclosed method, system, and product include a number of embodiments for detecting a row by column structure in a DRAM array. The disclosed embodiments may be translated into a computer readable code that is read by a processing system 810, shown in FIG. 5, which includes IBM compatible computers, telephones, personal digital assistants, and electronic organizers. The block elements illustrated in FIGS. 1–4, supporting descriptions, and alternative embodiments describe logic routines that can be translated into computer readable program code written in C, C++, assembly and other high level programming languages. Computer readable program code is storable on a computer usable medium such as magnetic disks, optical disks, and integrated circuits 820 (shown in FIG. 5).

Figure 5:
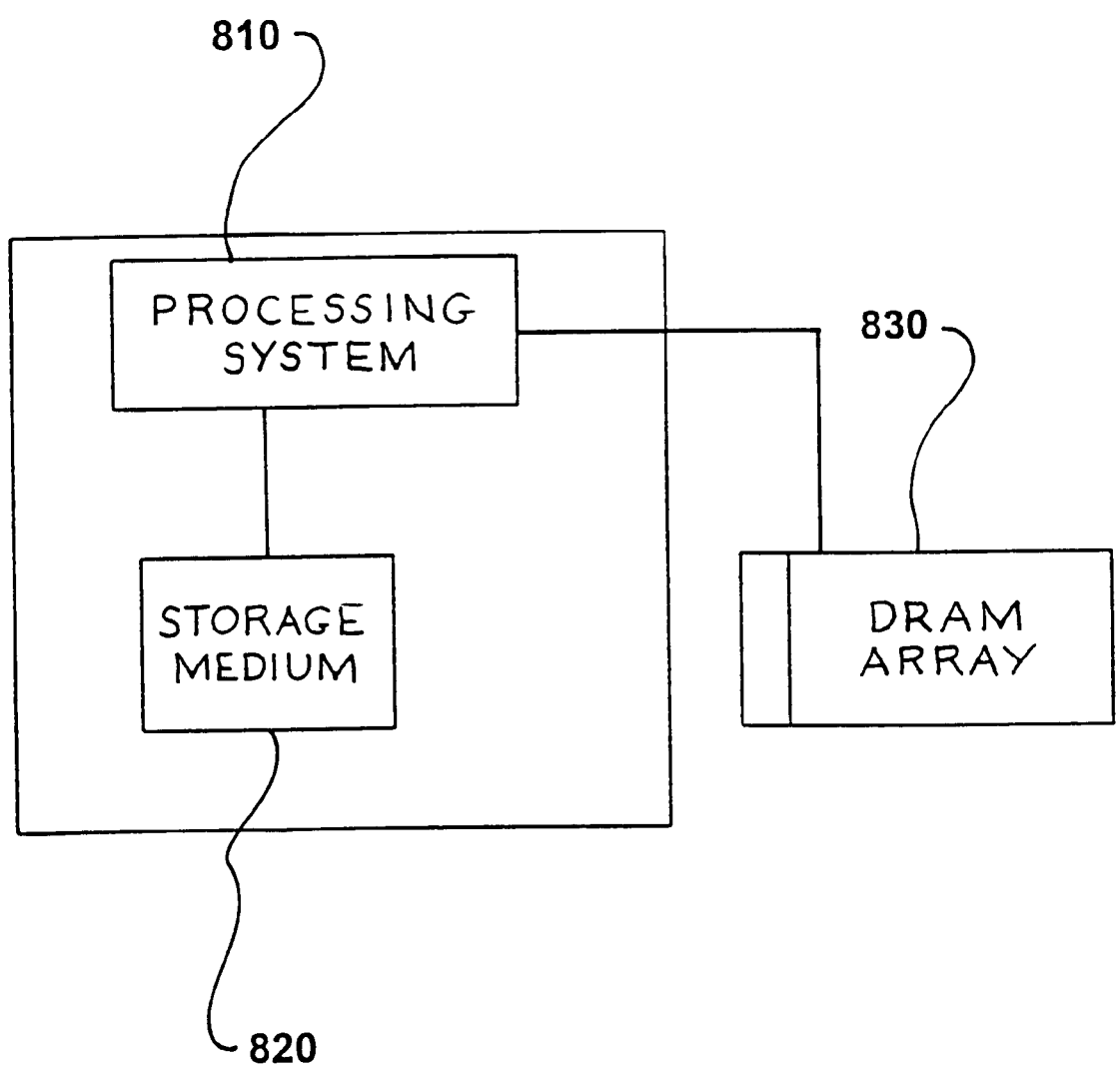
FIG. 5 illustrates a processing system structure for implementing the embodiments of FIGS. 1–4.

By employing a computer readable code to detect a row by column structure of a DRAM array 830, shown in FIG. 5, the disclosure enables consumers to upgrade electronic devices with additional or replacement DRAM arrays without the concern that the DRAM array will not be detected.

A system, method, and program that detects row by column structure of a plurality of DRAM cells are disclosed in a first embodiment illustrated in FIG. 1. The system, method, and program write data to and read data from a first memory address selected from a first series of cell addresses (step 10). DRAM cells, like cells in a spreadsheet, are arranged by a row and a column address. By designating a row and a column address, DRAM cells are read from and written to. In this process, the first eries of cell addresses correspond to a plurality of standard column structures. A row coordinate may be programmed to a base row address and a column coordinate may be programmed to one of a plurality of standard column addresses. The column coordinates may include, for example, column addresses having eight, nine, ten, or eleven high bits that correspond to column structures of $2^8$, $2^9$, $2^{10}$, and $2^{11}$ columns. When the column structure is identified, the process writes data to and reads data from a second memory address selected from a second series of cell addresses (steps 30–40). The second series of cell addresses correspond to a plurality of standard row structures. Like the detection of column structure, the detection of row structure includes a column coordinate programmed to a base address and a plurality of row coordinates programmed to standard row addresses. To ensure the process is not affected by data latch, the process may further write to a third and a fourth memory address selected from a third series of addresses and a fourth series of addresses before reading data from an address selected from the first and second series of addresses respectively. The data written to an address selected from a third series of addresses would preferably be the inverse of the data written to an address selected from the first series of addresses. If, for example, $AA is written to a memory address selected from the first series of addresses, the data written to a third address would be $55. By writing $55 to a third address before attempting to read $AA from one of the first series of addresses, the process attempts to clear $AA from the data bus before accessing memory. Similarly, data written to the fourth address selected from the fourth series of addresses would preferably be the inverse of the data written to the address selected from the second series of addresses.

In accordance with a second embodiment, FIG. 2 illustrates the sequential process steps for identifying a row by column structure of a plurality of DRAM cells. The sequential process steps begin by setting the maximum row boundary (MRB) and maximum column boundary (MCB) address of a DRAM array (step 120). The maximum column boundary address represents the highest number of possible columns and the maximum row boundary address represents the highest number of possible rows in the DRAM array. A row-modifier (RM) and a column-modifier (CM) are then initialized (step 130). The row-modifier and column-modifier are executed to access memory cells at a row or column boundary of the memory array. After the modifiers are initialized the location of the first memory address is calculated by subtracting the column-modifier from the maximum column boundary address (step 140). As shown in FIG. 2, data is then written to and read from a first memory address (FMA)(step 150). Data read from and written to the first memory address is tested by a comparison (step 160). If the data is not identical, a new column-modifier is calculated (step 180). This step is preferably a function of the maximum number of columns in the DRAM array. When the maximum number of columns is represented by the highest number of column address bits (c), for example, the column-modifier might be expressed as $2^{c(n)}-2^{(c(n)-1)}$ where $c(n)=c(n-1)-1$, $c(1)=c$, and 'n' is a counter incrementally increased. Thereafter, the process is repeated until the data written to the first memory address is identical to data read from the first memory address (steps 140–180).

When the data written to the first memory address is identical to the data read from the first memory address, the process calculates a second memory address (SMA) by subtracting the row-modifier from the maximum row boundary address (step 190). Thereafter, data is written to and read from the second memory address (step 200). The data is then compared (step 210). When the data is identical, the test concludes (step 240). However, when the data is not identical, the process is repeated using a new row-modifier (steps 220 and 230). The new row-modifier is preferably a function of the maximum number of rows in the DRAM array. When the maximum number of rows is represented by the highest number of row address bits (r), for example, the row-modifier might be expressed as $2^{(r(n)+c)}-2^{(r(n)+c-1)}$ where $r(n)=r(n-1)-1$, $r(1)=r$, and 'n' is a counter incrementally increased. Thereafter, steps 190 through 230 are repeated until identical data is found (steps 190–230). At the end of this process, if the memory has no defects at its boundary addressees, the row by column structure of the DRAM array will be known.

Those of ordinary skill in the art will appreciate that the maximum row and column boundary addresses, the column-modifiers, and row-modifiers may be pre-calculated. Accordingly, the steps of calculating these functions may be selecting or reading one or more pre-calculated values. Furthermore, to ensure that the write instructions are not affected by data latch, the process may further write to memory addresses selected from a third and a fourth series of addresses before reading data from the first and second memory addresses respectively. The data written to a third and fourth memory address preferably would be the inverse of the data written to the first and the second memory addresses respectively.

FIG. 3 shows a third embodiment where the sequential steps for identifying a row and column structure of the plurality of DRAM cells are a direct function of the highest number of column address bits and highest number of row address bits. The sequential steps begin by setting the number of column address bits (c), and maximum number of row address bits (r). As seen in FIG. 3, a first address is tested by first writing data to location $2^c-1$ (step 340). To prevent data latch, inverse data is then written to a second location having a different address such as, for example, $2^{(c-1)}-1$ (step 350). The data written in step 350 is the inverse of the data written in step 340. After inverse data is written to the second address location, the process reads data located at the first address location (step 360). Thereafter, the data read from and written to the first address is compared (step 370). When the data is not identical, the maximum number of column address bits is reduced (c=c−1), and steps 340 through step 390 are repeated until identical data is detected (step 380).

When identical data is detected, the column structure is known and the sequential steps proceed to determine the row structure of the DRAM array. As seen in FIG. 3, a third address is tested by writing data to location $2^{(r+c)}-1$ (step 400). To prevent data latch, inverse data is written to a fourth location having a different address such as, for example, $2^{(r+c)}-2$ (step 410). The data written in step 410 is the inverse of the data written in step 400. After inverse data is written to the fourth address location, data is read from the third address location (step 420). The data read from and written to the third address location is then compared (step 430). When the data is not identical, the maximum number of row address bits is reduced (r=r−1), and steps 400 through 450 are repeated. The iterative sequential steps continues until identical data is detected, whereby the row and column structure of the DRAM array is identified.

Figure 4B:
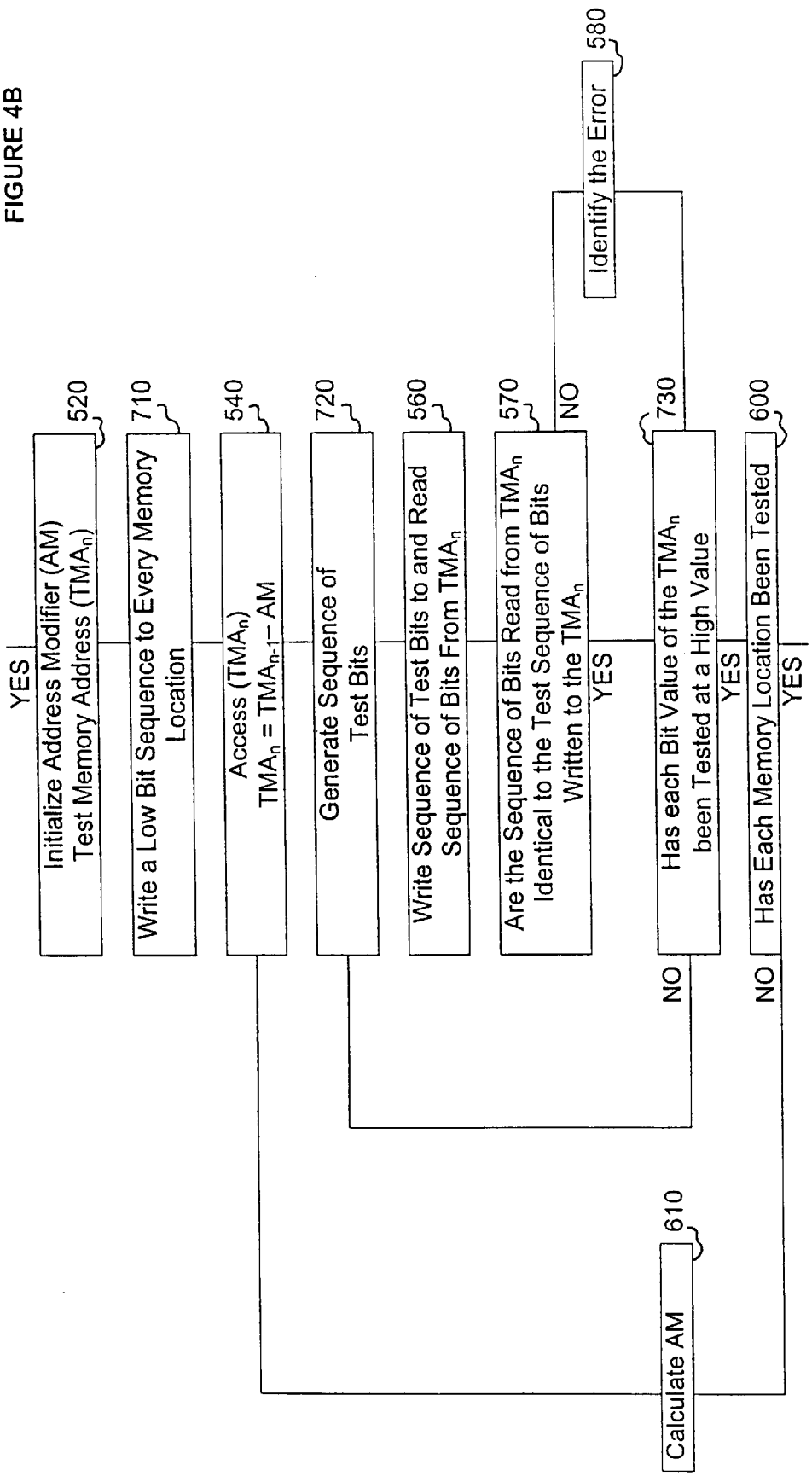

FIGS. 4A–4C show a fourth embodiment wherein the DRAM array's integrity is assured before its row and column structure is identified. In this embodiment, iterative sequential steps write to every memory location in the DRAM array before detecting array structure. With reference to FIGS. 4A & 4B, memory integrity is tested in two stages. In stage 1, as illustrated in FIG. 4A, a high bit sequence is written to every memory location before an iterative sequential low bit is written to and read from each memory cell. Where "n" is a counter incrementally increased until it reaches the number of bits in a memory location, the function f(n)=Inverse ($2^n$), for example, will generate a sequential bit sequence (i.e. $f_{4\ bit\ cell}$ (0)=(1110); $f_{4\ bit\ cell}$ (1)=(1101); $f_{4\ bit\ cell}$ (2)=(1011); $f_{4\ bit\ cell}$ (3)= (0111)). In stage 2, as illustrated in FIG. 4B, a low bit sequence is written to every memory location before an iterative sequential high bit is written to and read from each memory cell. f(n)=($2^n$), for example, will generate a sequential bit sequence (i.e. $f_{4\ bit\ cell}$ (0)=(0001); $f_{4\ bit\ cell}$ (1)= (0010); $f_{4\ bit\ cell}$ (2)=(0100); $f_{4\ bit\ cell}$ (3)=(1000)). Together, stage 1 and stage 2 test memory width at a high and a low bit value.

The sequential steps of the fourth embodiment begin by initializing a test memory address ($TMA_n$) and an address modifier (AM) (step 520). The address modifier represents an incremental counter employed to access each memory location within the DRAM array. After the test memory address and the address modifier are initialized, a high bit sequence is written to every memory location (step 530). A test memory address is then calculated by subtracting the address modifier from the previous test memory address ($TMA_n=TMA_{n-1}$—AM) (step 540). A sequence of test bits are then generated (step 550). Preferably, the sequence of test bits written to a memory address is distinct from any previous sequence written to that address. In stage 1, a sequential sequence of test bits having one low bit is generated (step 550). Thereafter, the sequence of test bits is written to and read from the test memory address (step 560). The sequence of test bits written to the test memory address is then compared to the sequence of test bits read from the test memory address (step 570). When the sequence of test bits written to and read from the test memory address are identical, steps 550 through 590 are repeated until the each bit of the test memory width is tested at a low bit value (steps 550–590). When the sequence of test bits written to and read from the test memory address are not identical, an error is identified, the process prevents access to the defective address, and the method for detecting the row by column structure evaluates adjacent cells if the defective address is selected in the further process steps. As illustrated in step 600, each memory location is tested before the process enters stage 2 (step 600). The address modifier is adjusted to ensure access to each successive address of the DRAM array (step 610). To prevent data latch, the process may further write either a high or low bit sequence to an address selected from a series of second test memory addresses. The process may further read from and test the second test memory address to verify the expected high or low bit sequences. This step further identifies and assures the detection of defective memory cells. The second test memory address is preferably derived by adding the address modifier to the test memory address but may also be derived by other operations that identifies an adjacent memory location.

Stage 2 is similar to stage 1. In stage 2, as illustrated in FIG. 4B, a low bit sequence is written to every memory location before an iterative series of bits having one high bit value are written to and read from each memory address. The process writes a low bit sequence to every memory location in step 710. At step 720, a sequence of test bits having one high bit is generated. Step 720 ensures each bit value of the test memory width is tested at a high value. Further processing steps in this stage are identical to the steps described in stage 1. Likewise, the further steps of writing, reading, testing, and identifying defective memory cells at a second test memory address are identical to stage 1. These steps were described above.

FIG. 4C is similar to the third embodiment illustrated in FIG. 3. The processing steps illustrated in FIGS. 4C are identical to FIG. 3 with the exception that data is referred to as a bit sequence. A description of the processing steps was provided above. The further processing steps described above may also be practiced in this embodiment. Furthermore, the column and row detection process illustrated in FIG. 4C may be replaced by the embodiments described in FIGS. 1 and 2.

Workers skilled in the art will appreciate the wide array of iterative and random processes in which memory may be accessed. Many other alternatives to accessing memory are possible. For example, memory addresses may be stored in non-volatile memory. In this case, the modifiers and address calculations may be replaced by a pre-programmed array of memory addresses that are read. In another alternative, the address locations may be selected by an I/O controller that iteratively or randomly accesses memory cells.

Workers skilled in the art will further appreciate that the System, Method, and Program for Detecting and Assuring DRAM Arrays may first sequentially detect the row structure before sequentially detecting the column structure in the embodiments disclosed herein. In another alternative, the row and column structure of the DRAM array may be detected before the integrity of the DRAM array is assured. In this alternative, if a defective memory cell is found, the steps of identifying the row and column structure of DRAM array may be repeated.

As used herein the following terms are used as indicated. The term "memory width" is intended to encompass the number of bits transferred to or from a single access of memory.

The term "row boundary" is intended broadly to encompass an address where the row coordinate consists of all ones and the column coordinate comprises a base address.

The term "column boundary" is intended broadly to encompass an address where the column coordinate consists of all ones and the row coordinate comprises a base address.

The term "automatically" is intended broadly to encompass software and or component circuitry that performs a series of specifically identified operations.

Variations and modifications of the descriptions disclosed in this specification may be made without departing from the scope and spirit of the invention. The aforementioned description is intended to be illustrative rather than limiting and it is understood that the following claims and their equivalents set forth the scope of the invention.

I claim:

1. A method for detecting a row by column structure of a plurality of DRAM memory cells arranged in a memory array, the method comprising the steps of:
   providing a plurality of DRAM memory cells arranged in a memory array, each cell being addressable by an address comprised of a row and a column address;
   identifying the number of columns in the memory array by writing data to and reading data from at least one address selected from a first series of cell addresses until the data written to and read from the selected address are identical; and identifying the number of rows in the memory array by writing data to and reading data from at least one address selected from a second series of cell addresses until the data read from and written to the selected address are identical, wherein the identification of the number of columns and the number of rows detects the row and the column structure of the DRAM memory cells.

2. The method of claim 1, wherein the first series of cell addresses are based on standard column structures.

3. The method of claim 1, wherein the second series of cell addresses are based on standard row structures.

4. The method of claim 1, wherein the first series of cell addresses are based on standard column structures and the second series of cell addresses are based on standard row structures.

5. The method of claim 1, further including the step of writing data to an address selected from a third series of cell addresses before data is read from the address selected from the first series of cell address.

6. The method of claim 5, wherein the data written to the address selected from the third series of cell addresses is the inverse of the data written to the first series of cell addresses.

7. A method for identifying a row by column structure in a replaceable plurality of DRAM memory cells usable in consumer products, the method comprising the steps of:

determining automatically the highest selectable column address of a DRAM memory array comprising a plurality of cells; and determining automatically the highest selectable row address in response to the detection of said highest selectable column address.

8. The method of claim 7, further comprising the step of testing the integrity of each of said DRAM memory array's plurality of cells.

9. The method of claim 8, wherein the step of testing the integrity of said DRAM memory array tests the entire memory width of said plurality of cells at a high and a low bit value.

10. The method of claim 8, wherein a detection of a memory error causes said system to repeat the steps of determining the highest selectable column address and determining the highest selectable row address.

11. A method for detecting the highest selectable address in a replaceable DRAM memory array interfaced to a consumer product, comprising the steps of:

(a) writing data to a first and a second highest selectable column address of a DRAM memory array; and then (b) comparing the data written to and read from said first highest selectable column address; and then (c) traversing the memory array and repeating steps (a) and (b) until the data written to and read from said first highest selectable column address is identical;

(d) writing data to a first and a second highest selectable row address of a DRAM memory array; and then (e) comparing the data written to and read from said first highest selectable row address; and then (f) traversing the memory array and repeating steps (d) and (e) until the data written to and read from said first highest selectable row address is identical.

12. A method for identifying a row by column memory structure of a plurality of DRAM memory cells, the method comprising the steps of:

(a) setting a maximum row and a maximum column boundary address; and then, (b) initializing a row-modifier and a column-modifier; and then, (c) selecting a first memory address, the selected first memory address having a column address corresponding to the maximum column boundary address less the column-modifier; and then, (d) testing the first memory address by writing data to and reading data from the first memory address; and then, (e) comparing the data read from the first memory address to the data written to the first memory address; and then, (f) calculating the column-modifier; and then, (g) repeating steps c though f until the data read from the first memory address is identical to the data written to the first memory address;

(h) selecting a second memory address, the selected second memory address having a row address corresponding to the maximum row boundary address less the row-modifier; and then, (I) testing the second memory address by writing data to and reading data from the second memory address; and then, (j) comparing the data read from the second memory address to the data written to the second memory address; and then, (k) calculating the row-modifier, and then, (l) repeating steps h though k until the data read from the second memory address is identical to the data written to the second memory address, wherein the method detects the row and column structure of the memory cells.

13. The method of claim 12, wherein the method further comprises providing a plurality of pre-calculated column-modifiers associated with a plurality of standard memory structures, wherein the step of calculating the column-modifier comprises selecting one of the pre-calculated column-modifiers.

14. The method of claim 12, wherein the method further comprises providing a plurality of pre-calculated row-modifiers associated with a plurality of standard memory structures, wherein the steps of calculating the row-modifier comprises selecting one of the pre-calculated row-modifiers.

15. The method of claim 12, wherein the method further comprises providing a plurality of pre-calculated row and column-modifiers associated with a plurality of standard memory structures, wherein the step of calculating the row-modifier comprises selecting one of the pre-calculated row-modifiers and the step of calculating the column-modifier comprises selecting one of the pre-calculated column-modifiers.

16. The method of claim 12, wherein the step of setting the maximum row and the maximum column boundary addresses comprises reading one of a plurality of pre-calculated maximum row and column boundary addresses.

17. The method of claim 12, wherein the step of testing the first memory address further includes the step of writing data to a third memory address before reading data from the first memory address, wherein the data written to the third memory address is the inverse of the data written to the first memory address.

18. The method of claim 17, wherein the step of testing the second memory address further includes the step of writing data to a fourth memory address before reading data from the second memory address, wherein the data written to the fourth memory address is the inverse of the data written to the second memory address.

19. A computer usable medium having a computer readable code embodied therein for causing a DRAM memory array having a selectable address to be detected, the computer readable program code in an article of manufacture, comprising:

first computer readable program code for automatically determining the highest selectable column address; and second computer readable program code for automatically determining the highest selectable row address in response to the detection of the highest selectable column address.

20. A computer usable medium having a computer readable code embodied therein for causing a DRAM memory array having a selectable address to be detected, the computer readable program code in a program product, comprising:

first computer readable program code for automatically testing the integrity of a DRAM memory array comprising a plurality of cells;

second computer readable program code for automatically determining the highest selectable column address in response to the assurance of said DRAM memory arrays integrity; and third computer readable program code for automatically determining the highest selectable row address in response to the detection of the highest selectable column address.

21. A computer usable medium having a computer readable code embodied therein for causing a DRAM memory array having a selectable address to be detected, the computer readable program code in a program product, comprising:

first computer readable program code for automatically determining the highest selectable column address of a DRAM memory array comprising a plurality of cells;

second computer readable program code for automatically determining the highest selectable row address in response to the detection of the highest selectable column address; and third computer readable program code for automatically testing the integrity of a DRAM memory array in response to the detection of the highest selectable row address.

22. The program product of claim 21, wherein the third computer readable program code further comprises first and second computer readable program code for automatically re-determining the highest selectable column and row address in response to the detection of a failed memory address.

23. The program product of claim 22, wherein the third computer readable code further comprises fourth computer readable code that prevents access to the failed memory address and causes the first and second computer readable program code to evaluate adjacent cells if the defective address is selected.

24. A computer usable medium having a computer readable code embodied therein for causing a DRAM memory array having a definable row and column structure of DRAM cells wherein each memory cell has a selectable address to be detected, the computer readable program code in an article of manufacture, comprising:

computer readable program code for causing a computer to effect, with respect to one address location $2^c-1$ at a time, read data and write data to a selectable addresses limited by c=c−1 until the data read to said selectable address is identical to the data written to said selectable address; and computer readable program code for causing a computer to effect, with respect to one address location $2^{(r+c)}-1$ at a time, read data and write data to a selectable addresses limited by r=r−1 until the data read to said selectable address is identical to the data written to said selectable address.

* * * * *